United States Patent

Disney et al.

(10) Patent No.: US 7,834,421 B2
(45) Date of Patent: Nov. 16, 2010

(54) ISOLATED DIODE

(75) Inventors: Donald R. Disney, Cupertino, CA (US); Richard K. Williams, Cupertino, CA (US)

(73) Assignee: Advanced Analogic Technologies, Inc., Santa Clara, CA (US)

( * ) Notice: Subject to any disclaimer, the term of this patent is extended or adjusted under 35 U.S.C. 154(b) by 229 days.

(21) Appl. No.: 12/072,653

(22) Filed: Feb. 27, 2008

(65) Prior Publication Data

US 2008/0197446 A1 Aug. 21, 2008

Related U.S. Application Data

(60) Continuation-in-part of application No. 12/069,941, filed on Feb. 14, 2008, and a continuation-in-part of application No. 11/890,993, filed on Aug. 8, 2007, which is a continuation of application No. 11/444,102, filed on May 31, 2006, and a continuation-in-part of application No. 10/918,316, filed on Aug. 14, 2004, now Pat. No. 7,422,938, which is a division of application No. 10/218,668, filed on Aug. 14, 2002, now Pat. No. 6,900,091, said application No. 11/890,993 is a continuation-in-part of application No. 11/204,215, filed on Aug. 15, 2005, now Pat. No. 7,489,016, which is a division of application No. 10/218,678, filed on Aug. 14, 2002, now Pat. No. 6,943,426.

(51) Int. Cl.
*H01L 29/68* (2006.01)

(52) U.S. Cl. ............... 257/544; 257/551; 257/E29.019; 257/E21.544

(58) Field of Classification Search ................. 257/504, 257/544, 551, E29.019, E21.544, E21.563
See application file for complete search history.

(56) References Cited

U.S. PATENT DOCUMENTS

| 4,269,636 A | 5/1981 | Rivoli et al. ................ 438/359 |
| 4,454,647 A | 6/1984 | Joy et al. ...................... 29/576 |
| 4,478,655 A | 10/1984 | Nagakubo et al. ........... 148/175 |
| 4,642,883 A | 2/1987 | Sakurai et al. .............. 438/362 |
| 4,655,875 A | 4/1987 | Wada et al. ................. 438/514 |
| 4,819,052 A | 4/1989 | Hutter ......................... 257/378 |
| 4,980,747 A | 12/1990 | Hutter et al. .................. 357/50 |
| 5,324,973 A | 6/1994 | Sivan ......................... 257/330 |
| 5,374,569 A | 12/1994 | Yilmaz et al. ................. 437/34 |
| 5,386,136 A | 1/1995 | Williams et al. ............ 257/409 |

(Continued)

FOREIGN PATENT DOCUMENTS

EP 0 589 675 A2 3/1994

(Continued)

*Primary Examiner*—Minh-Loan T Tran
*Assistant Examiner*—Leslie Pilar Cruz
(74) *Attorney, Agent, or Firm*—Patentability Associates

(57) ABSTRACT

Various integrated circuit devices, in particular a diode, are formed inside an isolation structure which includes a floor isolation region and a trench extending from the surface of the substrate to the floor isolation region. The trench may be filled with a dielectric material or may have a conductive material in a central portion with a dielectric layer lining the walls of the trench. Various techniques for terminating the isolation structure by extending the floor isolation region beyond the trench, using a guard ring, and a forming a drift region are described.

3 Claims, 10 Drawing Sheets

U.S. PATENT DOCUMENTS

| | | | | |
|---|---|---|---|---|
| 5,410,175 A | 4/1995 | Kyomasu et al. | | 257/458 |
| 5,420,061 A | 5/1995 | Manning | | 438/218 |
| 5,485,027 A | 1/1996 | Williams et al. | | 257/343 |
| 5,506,431 A | 4/1996 | Thomas | | 365/185.15 |
| 5,525,824 A | 6/1996 | Himi et al. | | 257/370 |
| 5,557,135 A | 9/1996 | Hashimoto | | 257/308 |
| 5,668,397 A | 9/1997 | Davis et al. | | 257/520 |
| 5,684,305 A | 11/1997 | Pearce | | 257/48 |
| 5,807,783 A | 9/1998 | Gaul et al. | | 438/406 |
| 5,883,413 A | 3/1999 | Ludikhuize | | 257/343 |
| 5,892,264 A | 4/1999 | Davis et al. | | 257/511 |
| 5,914,523 A | 6/1999 | Bashir et al. | | 257/520 |
| 5,986,863 A | 11/1999 | Oh | | 361/56 |
| 6,013,936 A | 1/2000 | Colt | | 257/506 |
| 6,130,458 A | 10/2000 | Takagi et al. | | 257/351 |
| 6,144,086 A | 11/2000 | Brown et al. | | 257/510 |
| 6,163,052 A | 12/2000 | Liu et al. | | 257/334 |
| 6,316,336 B1 * | 11/2001 | Blanchard | | 438/478 |
| 6,331,456 B1 | 12/2001 | Wu | | 438/154 |
| 6,383,892 B1 | 5/2002 | Colt | | 438/457 |
| 6,399,990 B1 * | 6/2002 | Brennan et al. | | 257/355 |
| 6,559,505 B1 | 5/2003 | Fallica | | 257/350 |
| 6,563,181 B1 * | 5/2003 | Du et al. | | 257/394 |
| 6,657,262 B2 | 12/2003 | Patti | | 257/370 |
| 6,740,958 B2 | 5/2004 | Nakazato et al. | | 257/550 |
| 6,855,985 B2 | 2/2005 | Williams et al. | | 257/338 |
| 6,900,091 B2 | 5/2005 | Williams et al. | | 438/228 |
| 6,943,426 B2 | 9/2005 | Williams et al. | | 257/500 |
| 7,009,271 B1 | 3/2006 | Thurgate et al. | | 257/510 |
| 7,049,663 B2 | 5/2006 | Wang | | 257/355 |
| 7,176,548 B2 | 2/2007 | Williams et al. | | 257/500 |
| 7,183,610 B2 | 2/2007 | Pattanayak et al. | | 257/333 |
| 7,268,045 B2 | 9/2007 | Hower et al. | | 438/282 |
| 2001/0000288 A1 | 4/2001 | Oh | | 257/409 |
| 2001/0013636 A1 | 8/2001 | Dunn et al. | | 257/565 |
| 2001/0015459 A1 | 8/2001 | Watanabe et al. | | 257/341 |
| 2002/0008299 A1 | 1/2002 | Leonardi | | 257/520 |
| 2002/0079555 A1 * | 6/2002 | Okawa et al. | | 257/565 |
| 2002/0084506 A1 | 7/2002 | Voldman et al. | | 257/511 |
| 2002/0130390 A1 * | 9/2002 | Ker et al. | | 257/546 |
| 2003/0057498 A1 | 3/2003 | Yamashita | | 257/369 |
| 2003/0107103 A1 | 6/2003 | Iwata et al. | | 257/506 |
| 2003/0168712 A1 | 9/2003 | Shin et al. | | 257/510 |
| 2004/0026746 A1 | 2/2004 | Nakazawa et al. | | 257/374 |
| 2004/0032005 A1 | 2/2004 | Williams et al. | | 257/510 |
| 2004/0033666 A1 | 2/2004 | Williams et al. | | 438/297 |
| 2004/0071030 A1 | 4/2004 | Goda et al. | | 365/222 |
| 2005/0014324 A1 | 1/2005 | Williams et al. | | 438/200 |
| 2005/0014329 A1 | 1/2005 | Williams et al. | | 438/318 |
| 2005/0087805 A1 | 4/2005 | Ning | | 257/350 |
| 2005/0142724 A1 | 6/2005 | Williams et al. | | 438/199 |
| 2005/0142791 A1 | 6/2005 | Williams et al. | | 438/369 |
| 2005/0142792 A1 | 6/2005 | Williams et al. | | 438/369 |
| 2005/0158939 A1 | 7/2005 | Williams et al. | | 438/199 |
| 2005/0179093 A1 | 8/2005 | Morris | | 257/371 |
| 2005/0179111 A1 | 8/2005 | Chao | | 257/510 |
| 2005/0189606 A1 | 9/2005 | Nakagawa | | 257/500 |
| 2005/0272207 A1 | 12/2005 | Williams et al. | | 438/261 |
| 2005/0272230 A1 | 12/2005 | Williams et al. | | 438/510 |
| 2005/0287765 A1 | 12/2005 | Onai et al. | | 438/438 |
| 2006/0076629 A1 | 4/2006 | Yilmaz | | 257/378 |
| 2006/0175635 A1 | 8/2006 | Arai et al. | | 257/197 |
| 2006/0223257 A1 | 10/2006 | Williams et al. | | 438/202 |
| 2007/0013021 A1 | 1/2007 | Zhang | | 257/500 |
| 2007/0132056 A1 | 6/2007 | Williams | | 257/510 |
| 2007/0158779 A1 | 7/2007 | Cannon et al. | | 257/500 |
| 2007/0241421 A1 | 10/2007 | Liu et al. | | 257/510 |
| 2007/0278568 A1 | 12/2007 | Williams et al. | | 257/335 |
| 2007/0278612 A1 | 12/2007 | Williams et al. | | 257/338 |
| 2008/0042232 A1 | 2/2008 | Williams et al. | | 257/338 |
| 2008/0044978 A1 | 2/2008 | Williams et al. | | 257/338 |
| 2008/0048287 A1 | 2/2008 | Williams et al. | | 257/338 |
| 2008/0191277 A1 | 8/2008 | Disney et al. | | 257/327 |
| 2008/0197408 A1 | 8/2008 | Disney et al. | | 257/335 |
| 2008/0197445 A1 | 8/2008 | Disney et al. | | 257/272 |
| 2008/0210980 A1 | 9/2008 | Disney et al. | | 257/204 |
| 2008/0213972 A1 | 9/2008 | Disney et al. | | 438/430 |
| 2008/0217699 A1 | 9/2008 | Disney et al. | | 257/378 |
| 2008/0230812 A1 | 9/2008 | Disney et al. | | 257/272 |
| 2008/0237656 A1 | 10/2008 | Williams et al. | | 257/262 |
| 2008/0237704 A1 | 10/2008 | Williams et al. | | 257/338 |
| 2008/0237706 A1 | 10/2008 | Williams et al. | | 257/343 |
| 2008/0237782 A1 | 10/2008 | Williams et al. | | 257/499 |
| 2008/0237783 A1 | 10/2008 | Williams et al. | | 257/513 |
| 2008/0290449 A1 | 11/2008 | Williams et al. | | 257/513 |
| 2008/0290450 A1 | 11/2008 | Williams et al. | | 257/513 |
| 2008/0290451 A1 | 11/2008 | Williams et al. | | 257/513 |
| 2009/0020811 A1 | 1/2009 | Voldman | | 257/337 |
| 2009/0101937 A1 | 4/2009 | Lee et al. | | 257/137 |
| 2009/0236683 A1 | 9/2009 | Williams et al. | | 257/499 |

FOREIGN PATENT DOCUMENTS

| | | |
|---|---|---|
| EP | 1357598 A1 | 10/2003 |
| GB | 2 362 508 | 11/2001 |
| KR | 10-0456691 | 11/2008 |

\* cited by examiner

ISOLATED DIODE

CROSS-REFERENCE TO RELATED APPLICATIONS

This application is a continuation-in-part of application Ser. No. 12/069,941, filed Feb. 14, 2008.

This application is a continuation-in-part of application Ser. No. 11/890,993, filed Aug. 8, 2007. Application Ser. No. 11/890,993 is a continuation of application Ser. No. 11/444,102, filed May 31, 2006, and a continuation-in-part of the following applications:

(a) application Ser. No. 10/918,316, filed Aug. 14, 2004, which is a divisional of application Ser. No. 10/218,668, filed Aug. 14, 2002, now U.S. Pat. No. 6,900,091, and (b) application Ser. No. 11/204,215, filed Aug. 15, 2005, which is a divisional of application Ser. No. 10/218,678, filed Aug. 14, 2002, now U.S. Pat. No. 6,943,426.

Each of the foregoing applications and patents is incorporated herein by reference in its entirety.

BACKGROUND OF THE INVENTION

In the fabrication of semiconductor integrated circuit (IC) chips, it is frequently necessary to electrically isolate different devices from the semiconductor substrate and from each other. One method of providing lateral isolation among devices is the well-known Local Oxidation Of Silicon (LOCOS) process, wherein the surface of the chip is masked with a relatively hard material such as silicon nitride and a thick oxide layer is grown thermally in an opening in the mask. Another way is to etch a trench in the silicon and then fill the trench with a dielectric material such as silicon oxide, also known as trench isolation. While both LOCOS and trench isolation can prevent unwanted surface conduction between devices, they do not facilitate complete electrical isolation.

Complete electrical isolation is necessary to integrate certain types of transistors including bipolar junction transistors and various metal-oxide-semiconductor (MOS) transistors including power DMOS transistors. Complete isolation is also needed to allow CMOS control circuitry to float to potentials well above the substrate potential during operation. Complete isolation is especially important in the fabrication of analog, power, and mixed signal integrated circuits.

Although conventional CMOS wafer fabrication offers high density transistor integration, it does not facilitate compete electrical isolation of its fabricated devices. In particular, the NMOS transistor contained in a conventional CMOS transistor pair fabricated in a P-type substrate has its P-well "body" or "back-gate" shorted to the substrate and therefore cannot float above ground. This restriction is substantial, preventing the use of the NMOS as a high-side switch, an analog pass transistor, or as a bidirectional switch. It also makes current sensing more difficult and often precludes the use of integral source-body shorts needed to make the NMOS more avalanche rugged. Moreover since the P-type substrate in a conventional CMOS is normally biased to the most negative on-chip potential (defined as "ground"), every NMOS is necessarily subjected to unwanted substrate noise.

Complete electrical isolation of integrated devices has typically been achieved using triple diffusions, epitaxial junction isolation, or dielectric isolation. The most common form of complete electrical isolation is junction isolation. While not as ideal as dielectric isolation, where oxide surrounds each device or circuit, junction isolation has historically offered the best compromise between manufacturing cost and isolation performance.

With conventional junction isolation, electrically isolating a CMOS requires a complex structure comprising the growth of an N-type epitaxial layer atop a P-type substrate surrounded by an annular ring of deep P-type isolation electrically connecting to the P-type substrate to form a completely isolated N-type epitaxial island having P-type material below and on all sides. Growth of epitaxial layers is slow and time consuming, representing the single most expensive step in semiconductor wafer fabrication. The isolation diffusion is also expensive, performed using high temperature diffusion for extended durations (up to 18 hours). To be able to suppress parasitic devices, a heavily-doped N-type buried layer (NBL) must also be masked and selectively introduced prior to epitaxial growth.

To minimize up-diffusion during epitaxial growth and isolation diffusion, a slow diffuser such as arsenic (As) or antimony (Sb) is chosen to form the N-type buried layer (NBL). Prior to epitaxial growth however, this NBL layer must be diffused sufficiently deep to reduce its surface concentration, or otherwise the concentration control of the epitaxial growth will be adversely impacted. Because the NBL is comprised of a slow diffuser, this pre-epitaxy diffusion process can take more than ten hours. Only after isolation is complete, can conventional CMOS fabrication commence, adding considerable time and complexity to the manufacturing of junction isolated processes compared to conventional CMOS processes.

Junction isolation fabrication methods rely on high temperature processing to form deep diffused junctions and to grow the epitaxial layer. These high temperature processes are expensive and difficult to perform, and they are incompatible with large diameter wafer manufacturing, exhibiting substantial variation in device electrical performance and preventing high transistor integration densities. Another disadvantage of junction isolation is the area wasted by the isolation structures and otherwise not available for fabricating active transistors or circuitry. As a further complication, with junction isolation, the design rules (and the amount of wasted area) depend on the maximum voltage of the isolated devices. Obviously, conventional epitaxial junction isolation, despite its electrical benefits, is too area wasteful to remain a viable technology option for mixed signal and power integrated circuits.

An alternative method for isolating integrated circuit devices is disclosed in U.S. Pat. No. 6,855,985, which is incorporated herein by reference. The modular process disclosed therein for integrating fully-isolated CMOS, bipolar and DMOS (BCD) transistors can be achieved without the need for high temperature diffusions or epitaxy. This modular BCD process uses high-energy (MeV) ion implantation through contoured oxides to produce self-forming isolation structures with virtually no high temperature processing required. This low-thermal budget process benefits from "as-implanted" dopant profiles that undergo little or no dopant redistribution since no high temperature processes are employed.

Dopants, implanted through a LOCOS field oxide, form conformal isolation structures that in turn are used to enclose and isolate multi-voltage CMOS, bipolar transistors and other devices from the common P-type substrate. The same process is able to integrated bipolar transistors, and a variety of double junction DMOS power devices, all tailored using conformal and chained ion implantations of differing dose and energy.

While this "epi-less" low thermal budget technique has many advantages over non-isolated and epitaxial junction isolation processes, in some cases its reliance on LOCOS may impose certain limitations on its ability to scale to smaller dimensions and higher transistor densities. The principle of conformal ion implantation in the LOCOS based modular BCD process is that by implanting through a thicker oxide layer dopant atoms will be located closer to the silicon surface and by implanting through a thinner oxide layer, the implanted atoms will be located deeper in the silicon, away from the surface.

As described, a fully-isolated BCD process with implants contoured to LOCOS, while easily implemented using a 0.35 micron based technology, may encounter problems when scaled to smaller dimensions and tighter line widths. To improve CMOS transistor integration density, it may be preferable to reduce the bird's beak taper of the field oxide layer to a more vertical structure so that the devices can placed more closely for higher packing densities. The narrow LOCOS bird's beak however may cause the width of the isolation sidewall to become narrowed and isolation quality may be sacrificed.

In situations where these problems are significant, it would be desirable to have a new strategy for fully isolating integrated circuit devices, particularly high-voltage devices, that uses a low-thermal-budget, epi-less integrated circuit process, but one that eliminates the narrow sidewall problem described above to allow more compact isolation structures.

BRIEF SUMMARY OF THE INVENTION

Embodiments according to this invention are generally formed in a semiconductor substrate of a first conductivity type that does not include an epitaxial layer. An embodiment of an isolated lateral DMOS transistor (LDMOS) includes a floor isolation region of a second conductivity type and a dielectric-filled trench extending from a surface of the substrate to the floor isolation region, the trench and the floor isolation region forming an isolated pocket of the substrate. The LDMOS includes a well of the first conductivity type in the isolated pocket which serves as the body of the LDMOS, the well comprising a shallow portion and a deep portion, the shallow portion being located adjacent the surface of the substrate, the deep portion being located below the shallow portion, the shallow portion having a first doping concentration, the deep portion having a second doping concentration, the second doping concentration being greater than the first doping concentration.

In a second embodiment of an isolated LDMOS, the trench includes a conductive material at a central portion and the walls of the trench are lined with a dielectric material. The isolated pocket includes a drift region of the second conductivity type adjacent the drain region and a shallow trench isolation (STI) structure adjacent the surface of the substrate in the isolated pocket, the STI structure being enclosed on its sides and bottom by the drift region. The isolated pocket may also include submerged snapback control regions of the first conductivity type beneath the source region and/or the drain region.

In an isolated quasi-vertical DMOS (QVDMOS) according to the invention, the trench includes a conductive material at a central portion and the walls of the trench are lined with a dielectric material. The isolated pocket includes a source region of the second conductivity type at the surface of the substrate. Current flows horizontally from the source region through a channel region that underlies a gate and then vertically to the floor isolation region, which is comprised in the drain of the QVDMOS.

In an isolated junction field-effect transistor (JFET) according to the invention, the trench includes a conductive material at a central portion and the walls of the trench are lined with a dielectric material. The isolated pocket includes source and drain regions of the first conductivity type and a top gate region of the second conductivity type at the surface of the substrate. A channel region of the first conductivity type is located between a bottom of the top gate region and the floor isolation region.

In a second embodiment of an isolated junction field-effect transistor (JFET), the isolated pocket includes source and drain regions of the second conductivity type and a top gate region of the first conductivity type at the surface of the substrate and a bottom gate region of the first conductivity type submerged in the substrate. A channel region of the second conductivity type is located between a bottom of the top gate region and an upper boundary of the bottom gate region.

In a depletion-mode MOSFET according to the invention, the trench includes a conductive material at a central portion and the walls of the trench are lined with a dielectric material. The isolated pocket contains source and drain regions of a second conductivity type and the doping concentration of the channel region under the gate is substantially equal to the background doping concentration of the substrate. To reduce impact ionization and suppress snapback, a submerged region of the first conductivity type may be formed at least partially under the gate.

In an isolated diode according to the invention, the isolated pocket contains an anode region of the first conductivity type. The floor isolation region serves as the cathode of the diode and is contacted via the conductive material in the trench.

The invention also comprises termination structures for the region bordering the trench outside the isolated pocket. A guard ring of the first conductivity type may be formed at a surface of the substrate outside the isolated pocket and the floor isolation region may extend laterally beyond the outside edge of the trench. A submerged region of the first conductivity type may be formed below the guard ring. A drift region of the second conductivity type may be formed adjacent the surface of the substrate and the trench outside the isolated pocket. One or more additional trenches comprising a dielectric material may be formed in the drift region or in the substrate between the trench and the guard ring.

DETAILED DESCRIPTION OF THE INVENTION

Figure 1:
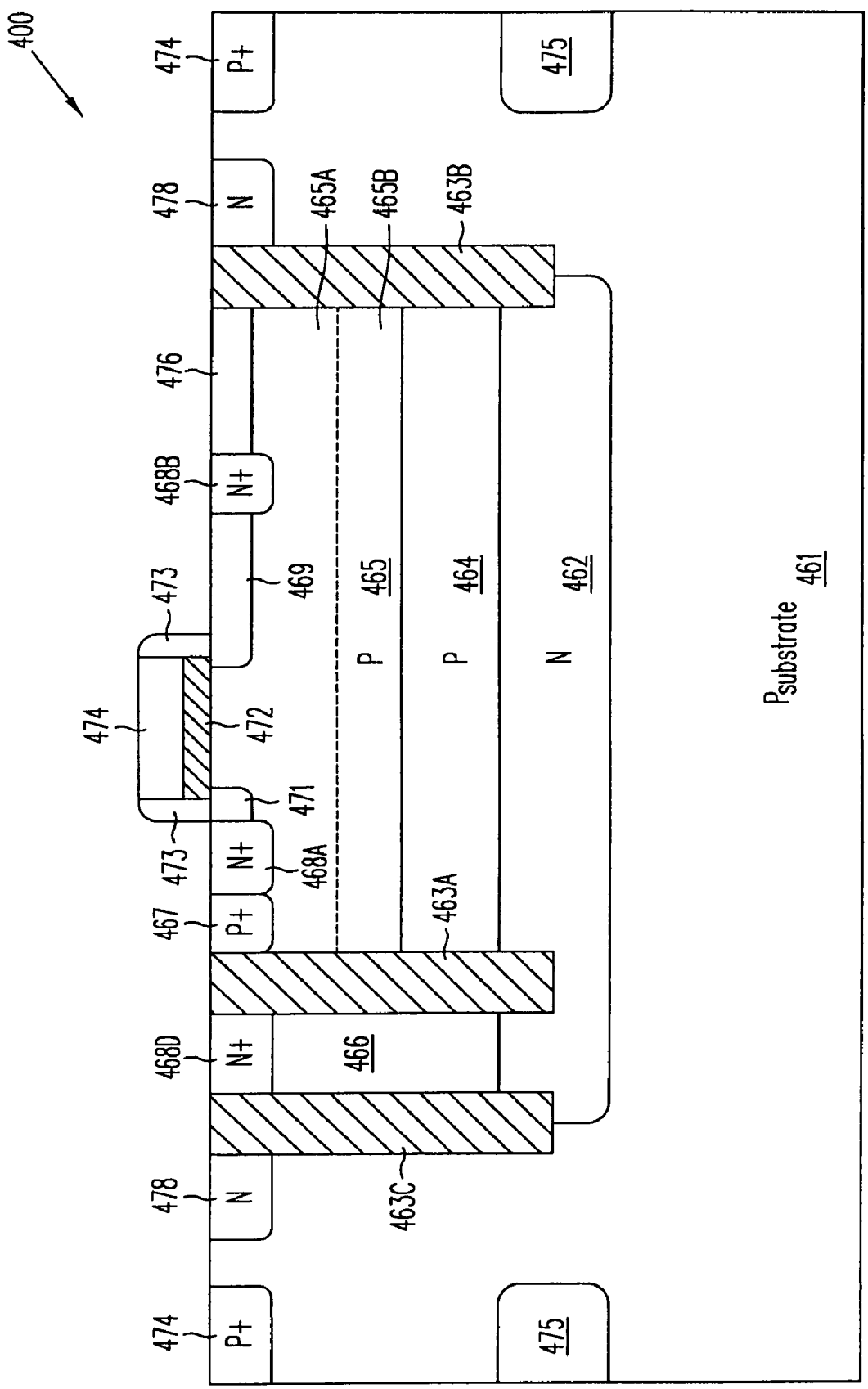
FIG. 1 illustrates a cross-sectional view of a fully isolated N-channel lateral DMOS (LDMOS).

FIG. 1 illustrates a schematic cross-section of a fully isolated N-channel lateral DMOS (LDMOS) 400 made in accordance with this invention and fabricated without the need for epitaxial deposition or high temperature diffusions. The LDMOS 400 is fabricated in isolated P-type region 464. P-type region 464 and the lateral DMOS 400 fabricated within P-type region 464 are isolated from P-type substrate 461 by high-energy implanted N-type floor isolation region 462 and dielectric-filled trenches 463A and 463B.

The N-channel LDMOS 400 comprises: N+ drain region 468B, spaced from gate 474 by implanted N-type lightly-doped drain (LDD) region 469 and spaced from trench 463B by LDD 476 region, gate 474, preferably comprising polysilicon and/or silicide, gate oxide layer 472, N+ source region 468A, P+ body contact region 467 contacting a P-type well 465 comprising the body region of LDMOS 400. P-type well 465 may include at least an upper portion 465A and a lower portion 465B or any number of regions comprising implants of varying energy and dose. The deeper portion 465B of P-type well 465 may preferably comprise a higher doping concentration than the upper portion 465A of P-type well 465.

Sidewall spacers 473 and lightly-doped source extension 471 are artifacts of CMOS fabrication and are not beneficially required for proper operation of the LDMOS 400. Because of its relatively high doping concentration, the effect of source extension 471 on the LDMOS 400 is negligible.

Floor isolation region 462 is electrically contacted from the surface of the substrate 461 through N-type well 466 and N+ contact region 468D. Well 466 is located in an area bounded by trenches 463A and 463C. As will be apparent, trenches 463B and 463C may be parts of a single trench that is in the shape of a closed figure, and trench 463A may divide the portion of the substrate 461 enclosed by trenches 463B and 463C into a first section containing source region 468A, drain region 468B and P-type well 465 and a second section containing well 466.

The DN floor isolation region 462 may be electrically biased to the potential of DMOS drain region 468B, P-type well 464, substrate 461, or some other fixed or variable potential. The maximum voltage differential between floor isolation region 462 and drain region 468B is limited to N-I-N punch-through breakdown voltage between floor isolation region 462 and drain region 468B, while the maximum voltage differential between floor isolation region 462 and P-type well 465 is set by P-I-N reach-through breakdown voltage between floor isolation region 462 and P-type well 465. In one embodiment, the floor isolation region 462 and drain region 468B are electrically shorted together, eliminating the possibility of N-I-N punch-through breakdown and limiting the $BV_{DSS}$ of LDMOS 400 to the P-I-N avalanche breakdown voltage between P-type well 465 and DN floor isolation region 462. In another embodiment, the floor isolation region 462 and the substrate 461 are electrically shorted together so that the P-type well 465 can be biased below ground, i.e. to a potential more negative than the substrate 461. Another alternative is to "float" the floor isolation region 462, in which case the potential of the floor isolation region 462 can change until N-I-N punch-through to N+ drain region 468B occurs, whereupon the potential of floor isolation region 462 will follow the potential of drain region 468B.

While the isolated N-channel LDMOS 400 is asymmetric, it may also be constructed symmetrically with the N+ drain region 468B at the center. Alternatively, LDMOS 400 could be constructed with the P-type well 465 at the center.

While the outer edge of the LDMOS 400 can coincide with trenches 463B and 463C, in an alternative embodiment, N-type termination region 478 biased at the potential of drain region 468B may surround trench 463C and increase the breakdown voltage of LDMOS 400 relative to substrate 461. If trenches 463B ad 463C are in the shape of a closed figure, termination region 478 may lie adjacent the entire outer periphery of the trenches 463B and 463C. LDMOS 400 may also be surrounded by P+ substrate contact region 474 and/or by deep implanted P-type region 475.

Figure 2:
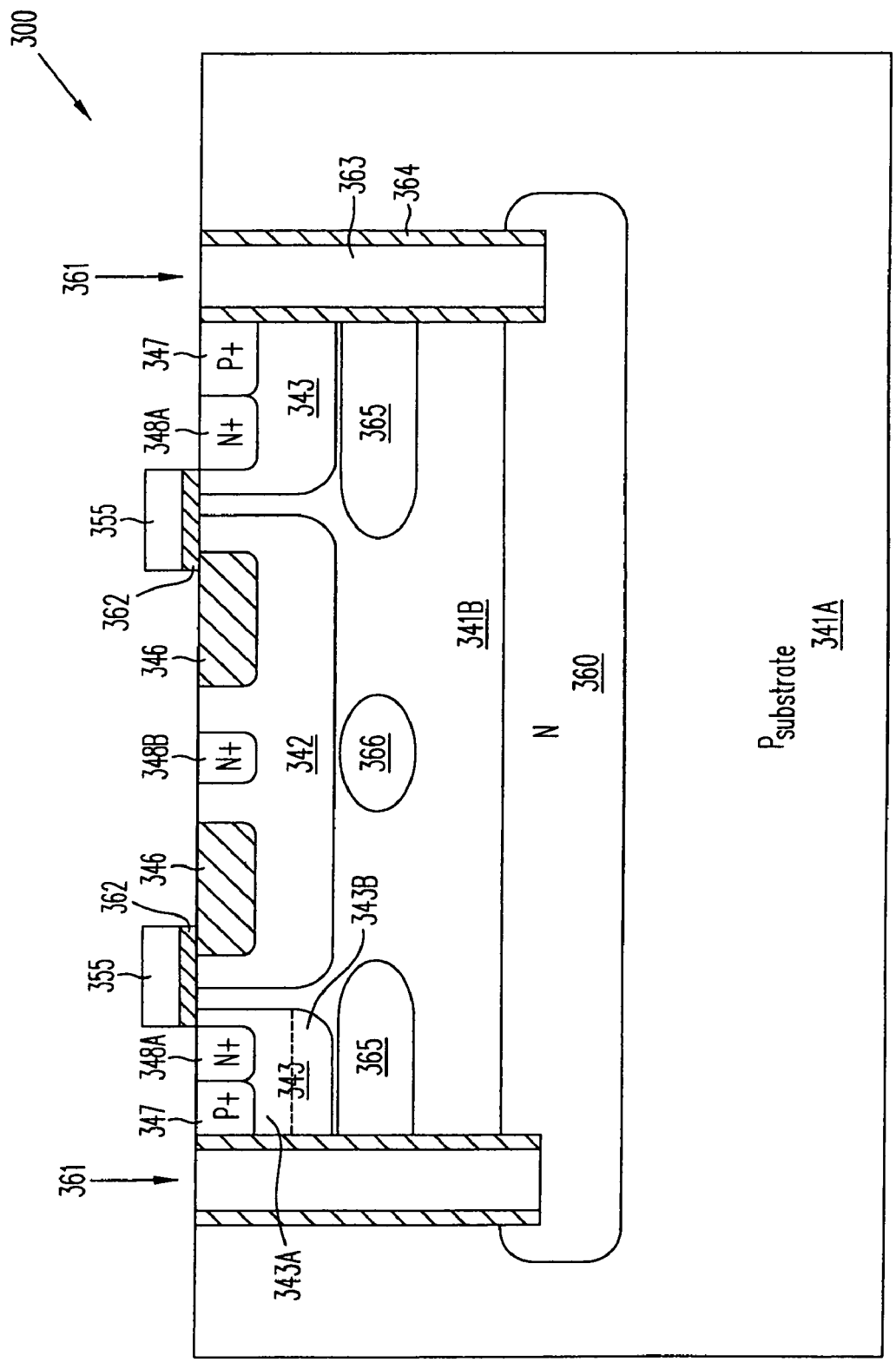
FIG. 2 illustrates a cross-sectional view of an alternative embodiment of an isolated N-channel LDMOS.

FIG. 2 shows a schematic cross-section of an isolated N-channel lateral DMOS 300, fabricated in a P-type region 341B which is isolated from P-type substrate 341A by deep implanted N-type floor isolation region 360 and filled trench 361. In a preferred embodiment, filled trench 361 surrounds the LDMOS 300 to provide lateral isolation, while the floor isolation region 360 provides vertical isolation. Trench 361 comprises a conductive central portion 363 that is laterally surrounded by insulating sidewalls 364, which isolate the conductive central portion 363. The conductive central portion 363 provides electrical contact between floor isolation region 360 and the surface of the substrate 341A, for ease of interconnection.

The LDMOS 300 comprises a central N+ drain region 348B and N-type drift region 342 circumscribed by gate 355 disposed atop gate dielectric layer 362. In a preferred embodiment, a dedicated implant is used to form drift region 342, in order to tailor its doping profile for optimized performance of LDMOS 300. In another embodiment, an N-type well that is shared with other CMOS devices can be substituted for dedicated drift region 342, compromising the performance of LDMOS 300 but reducing processing costs.

Gate 355 overlaps a portion of drift region 342 and is surrounded by N+ source region 348A and P+ body contact region 347. P-type well 343, preferably comprising a boron chain implanted region having a non-Gaussian or non-monotonic doping concentration profile, underlaps gate 355 and forms the body region of LDMOS 300. P-type well 343 may comprise a non-monotonic doping profile including at least an upper portion 343A and a lower portion 343B or any number of regions comprising implants of varying energy and dose. The lower portion 343B of P-type well 343 preferably comprises a higher doping concentration than the upper portion 343A of P-type well 343. In the embodiment shown in FIG. 2, the end of P-type well 343 is laterally spaced apart from drift region 342. As a result, the channel of LDMOS 300 has two doping concentrations, the heavier concentration of P-type well 343, which sets the threshold voltage of LDMOS 300 and prevents punch-through breakdown, and the lighter concentration of region 341B which determines avalanche breakdown voltage and impact ionization of LDMOS 300. In another embodiment, P-type well 343 abuts drift region 342, in which case the channel of LDMOS 300 has a single doping concentration equal to the doping concentration of P-type well 343.

Drift region 342 is partially disposed beneath shallow trench isolation (STI) structure 346, i.e., a shallow trench filled with silicon oxide. One benefit of including STI 346 above drift region 345 is that the net integrated charge of drift region 342 under STI 346 is reduced because dopant is removed during the formation of the trench. The net integrated charge of drift region 342, measured in units of atoms/cm² is the integral of the dopant concentration of drift region 342 from the silicon oxide interface at the bottom of STI 346 to the bottom of the drift region 342, namely $$Q_{Dtrench} = \int_{x_{trench}}^{x_j(drift)} N_{Ddrift}(x)\,dx \equiv \alpha \cdot Q_D$$

The variable α represents the percentage of the implanted normal charge in drift region 342 remaining after formation of STI 346, i.e. the dopant not removed by etching the trench which holds STI 346. The reduced charge causes a reduction in surface electric fields under gate 355, and in conjunction with the field plate effect of gate 355, reduces impact ionization and the risk of hot carrier damage.

Controlling the location of breakdown and the magnitude of impact ionization is an important consideration in fabricating reliable and robust high voltage and power LDMOS devices. Inclusion of the body region 343 in LDMOS 300 helps prevent punch-through breakdown and reduces the sensitivity of LDMOS 300 to bipolar injection and snapback by limiting the gain of the parasitic lateral NPN bipolar transistor present in LDMOS 300, comprising the emitter represented by source region 348A, the base represented by body region 343 and region 341B, and the collector represented by drift region 342 and drain region 348B. The body of LDMOS 300 cannot, however, prevent snapback due to modulation of the background doping concentration resulting from localized impact ionization in the drift region 342.

In accordance with this invention, two methods are used to control snapback. First, referring again to FIG. 2, an implanted deep P-type region 365 is disposed beneath the source region 348A and is used to suppress the electric field under the gate and move the high electric field location away from regions of high current density. This approach is referred to herein as "subsurface shielding" and deep P-type region 365 may be referred to as a subsurface shielding region. The second approach is to clamp the maximum drain voltage of LDMOS 300 to a voltage below the onset of snapback so that the snapback phenomenon does not occur. This method is referred to herein as "drain clamping" and may be implemented by the inclusion of a DP region 366 beneath drain region 348B. DP region 366 concentrates the vertical electric field beneath the drain region 348B to force bulk, i.e. non-surface, avalanche breakdown far away from hot-carrier sensitive gate dielectric layer 362. DP region 366 may be referred to as a drain clamping region.

An alternative to a lateral DMOS transistor is the quasi-vertical DMOS transistor. In a lateral DMOS, the current flows laterally, i.e. parallel to the wafer surface, through its lightly doped drift region. In the quasi-vertical DMOS current flows laterally and vertically, i.e. substantially perpendicular to the wafer surface. The current flows from the DMOS surface channel region of the device down into a heavily doped subsurface layer where it flows laterally, and then flows vertically back up to the drain contact, hence the name "quasi-vertical".

Figure 3:
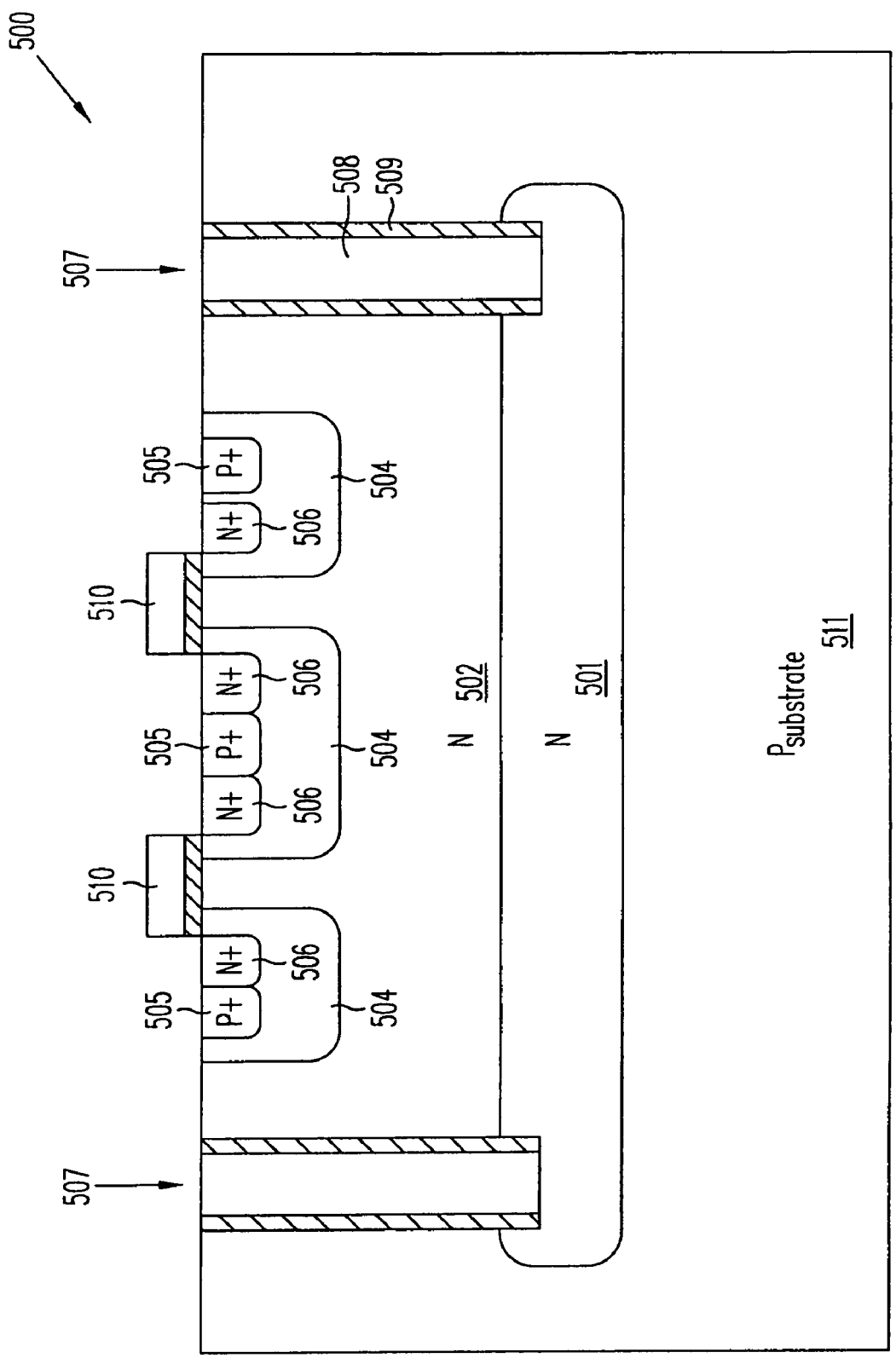
FIG. 3 illustrates a cross-sectional view of an isolated N-channel quasi-vertical DMOS.

A schematic cross-section of an N-channel quasi-vertical DMOS (QVDMOS) transistor 500 is shown in FIG. 3. This device includes gate 510, which is preferably formed as a series of stripes or closed geometric forms, N+ source regions 506, P-type body regions 504, P+ body contact regions 505. The P-body regions are formed inside N-type well 502, which comprises the drift region of the QVDMOS 500 and overlaps onto N-type floor isolation region 501, which is submerged in P-type substrate 511 and is comprised in the drain of the QVDMOS 500.

Filled trench 507 laterally encloses the QVDMOS 500, providing isolation from other devices fabricated in substrate 500. Filled trench 507 has a conductive material 508 in a central portion that extends from the surface of substrate 500 down to floor isolation region 501. The conductive material 508 is laterally surrounded by an insulating material 509 that lines the sidewalls of the trench 507, such that the conductive material 508 is electrically isolated from N-well 502 and substrate 511. When the QVDMOS 500 is in the on-state, electron current flows from N+ source regions 506, laterally through channels formed at the surface of P-body regions 504, vertically down through N-well 502, laterally through floor isolation region 501, and vertically up through the conductive material 508 in filled trench 507. Thus contact to the source regions 506 and the drain (floor isolation region 501) are easily achieved from the surface of the substrate 511.

P-body regions 504 may be implanted prior to the formation of gate 510 in which case they will not be self-aligned to gate 510. Alternatively, P-body regions 504 may be implanted using a large angle tilt implantation, after gate 510 is formed, with the result that P-body regions 504 are self-aligned to the edges of gate 510. Large angle tilt implantation allows the formation of a relatively large overlap of P-body regions 504 with gates 510, without the need for high-temperature diffusions.

In another embodiment of the QVDMOS (not shown), sidewall spacers and N-type lightly doped source regions may be formed at each edge of gate 505, as an artifact of CMOS fabrication using the same gate layer. If a dedicated gate layer is used to form gate 505, as shown in FIG. 3, the sidewall spacers will not be present in the device. In such a case the N+ source regions will self align to the gate 510; otherwise, the N+ source regions self-align to the sidewall spacers and the N-source extensions self align to the gate.

The techniques of subsurface shielding and drain clamping, described above, can be combined with any variety of drain and drain extension structure made in accordance with this invention.

JFETs and Depletion-Mode MOSFETs

Unlike conventional enhancement-mode MOSFETs which are "normally-off" devices, JFETs and depletion-mode MOSFETs conduct drain current even when their gate is biased to their source potential, i.e. they conduct at $V_{GS}=0$. Such devices are convenient in forming current sources for start-up circuitry when other transistors are not yet operational, since the transistors are normally "on".

In a depletion-mode N-channel field effect transistor, the threshold voltage must be less than zero volts, so that even at a zero volt or greater gate bias condition $V_{GS} \geq 0$, the device is in its conducting state. An N-channel JFET is also "on" at a zero volt gate drive, although the threshold voltage of a JFET is referred to as its "pinch-off" voltage, or $V_{pn}$. N-channel depletion-mode devices and JFETs can only be turned off by biasing their gates to a negative potential. Conversely, a positive gate bias increases the drain bias of an N-channel device. N-channel JFETs, however, are limited in their maximum gate drive to the forward biased voltage of the gate-to-source P-N diode. P-channel JFETs also conduct at a zero-volt gate drive, but a positive gate drive, i.e. the gate biased to a potential more positive than the source, is required to turn them off.

Figure 4:
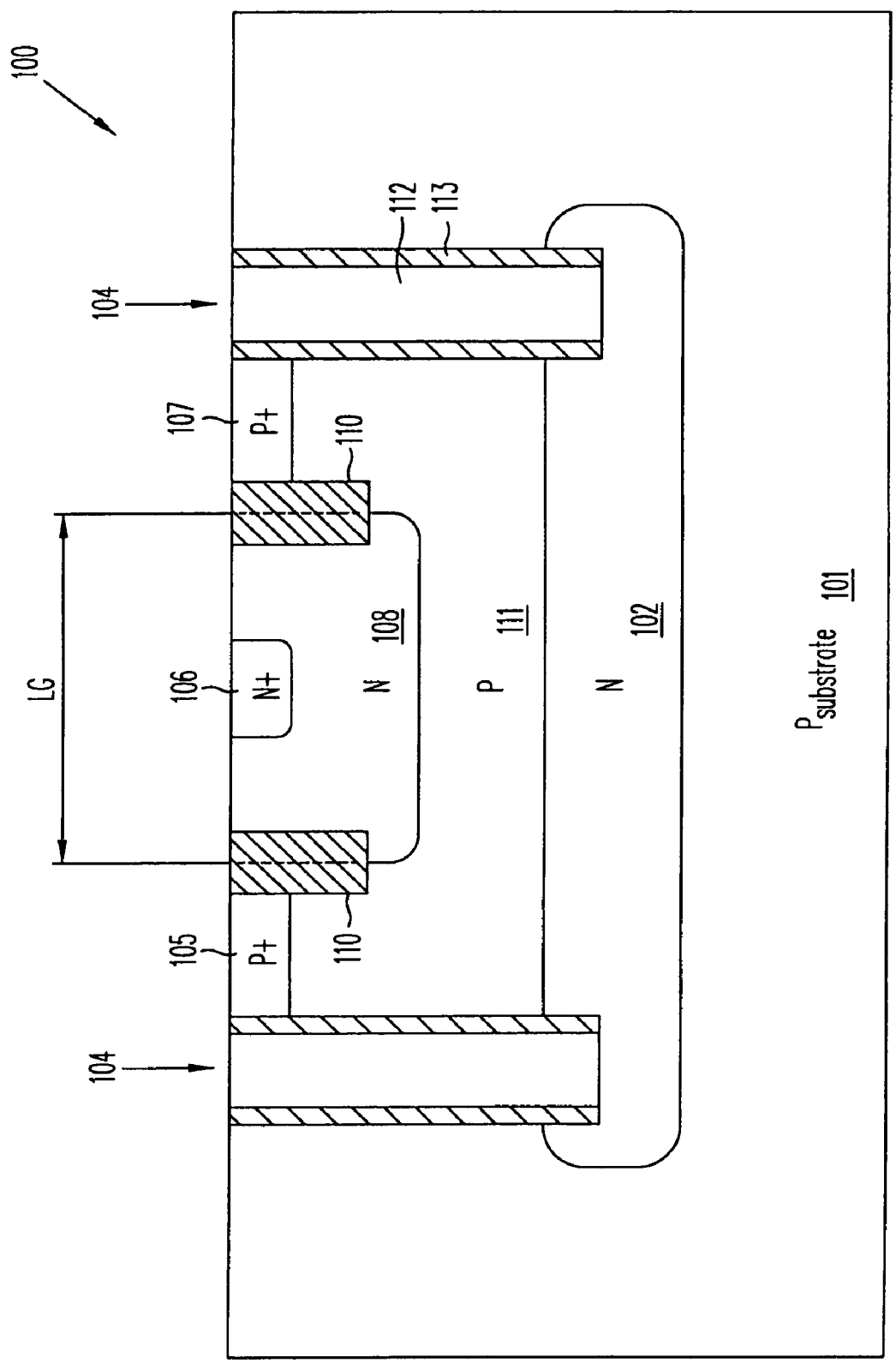
FIG. 4 illustrates a cross-sectional view of an isolated P-channel JFET.

A schematic cross-section of an isolated P-channel JFET 100 is shown in FIG. 4. P-channel JFET 100 includes P+ drain region 107, P-type channel region 111, an N-type top gate comprising N+ region 106 and optional N-type region 108, a bottom gate comprising N-type floor isolation region 102, and P+ source region 105. The length $L_G$ of the N-type gate is preferably 1 to 20 microns and is defined by the length of the top gate—N+ region 106 or N-type region 108, whichever is longer.

JFET 100 is isolated from P-type substrate 101 vertically by floor isolation region 102 and laterally by filled trench 104. The floor isolation region 102 serves as the bottom gate of the JFET 100. Electrical contact from the surface of the substrate 101 is provided by conductive material 112 at the central portion of the filled trench 104. Insulating material 113 laterally surrounds the conductive material 112 to insulate conductive material 112 from substrate 101 and P-channel region 111. The bottom gate (floor isolation region 102) is electrically biased at a potential "BG," and this bottom gate bias BG may vary in proportion with the potential "TG" of the top gate (N+ region and N-type region 108), or BG may be set at a fixed potential.

The pinch-off voltage of JFET 100 is determined by the doping concentration of channel region 111 and the vertical dimension of channel region 111 between NB region 108 and floor isolation region 102. In one embodiment, the doping concentration of region 111 is substantially the same as the doping concentration of substrate 101. In another embodiment, the doping concentration of region 111 is increased by implanting additional dopant to tailor the pinch-off voltage of JFET 100.

Shallow trenches 110 may be disposed around N-type region 108 to isolate N-type region 108 from source 105 and drain 107. In a preferred embodiment, trenches 110 are shallower and narrower than trench 104, since trenches 110 should not contact floor isolation region 102. Trenches 110 are preferably filled completely with a dielectric material.

Figure 5:
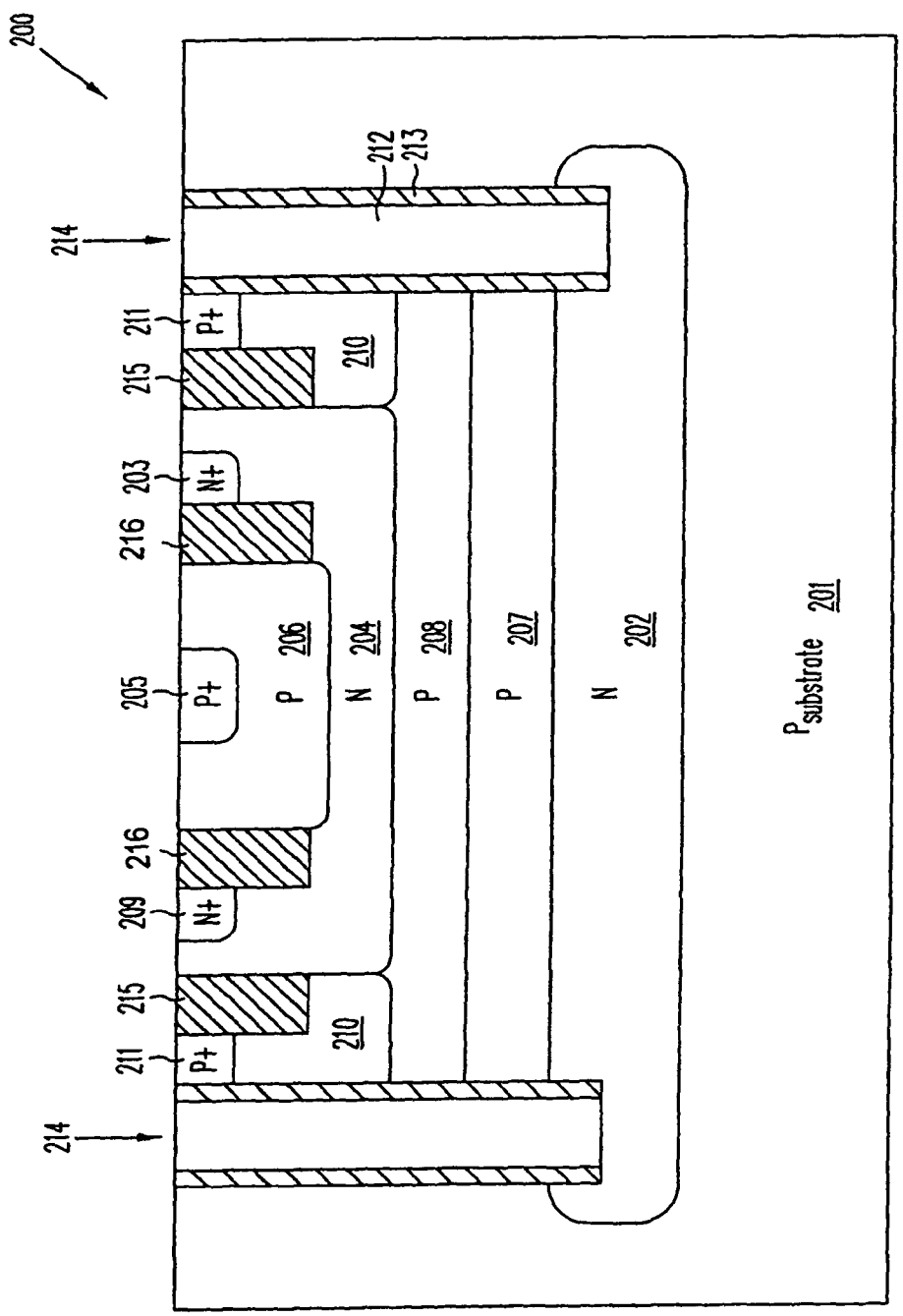
FIG. 5 illustrates a cross-sectional view of an isolated N-channel JFET.

A schematic cross-section of an isolated N-channel JFET 200 is shown in FIG. 5. JFET 200 includes N+ drain region 203, N-type channel region 204, a P-type top gate comprising P+ region 205 and optional P-type region 206, a bottom gate comprising isolated P-type pocket 207 and optional deep implanted P-type region 208, and P+ source region 209. The bottom gate is electrically biased at a potential "BG" through P-type well 210 and P+ bottom gate contact region 211. The bottom gate bias BG may vary in potential in proportion with the potential "TG" of the top gate, or BG may be set at a fixed potential. The pinch-off voltage of JFET 200 is determined by the doping concentration and thickness of N-channel region 204.

JFET 200 is isolated from P-type substrate 201 vertically by N-type floor isolation region 202 and laterally by filled trench 214. Electrical contact from the surface of the substrate is provided by conductive material 212 in a central portion of the filled trench 214. Insulating material 213 laterally surrounds the conductive material 212 to insulate conductive material 212 from substrate 201 and P-type regions 210, 208, and 207.

Shallow trenches 216 may be disposed around P-type region 206 to isolate the top gate 206 from source region 209 and drain region 203. In addition, shallow trenches 215 may be used to laterally isolate P+ bottom gate contact region 211 from channel region 204, source region 209 and drain region 203. In a preferred embodiment, trenches 215 and 216 are shallower and narrower than trench 214, since trenches 215 and 216 should not contact floor isolation region 202. Trenches 215 and 216 are preferably filled completely with a dielectric material.

In another embodiment, the floor isolation region 202 may be eliminated, such that the bottom gate of the N-channel JFET 200 comprises the P-type substrate 201 and/or the optional deep P-type region 208.

Figure 6:
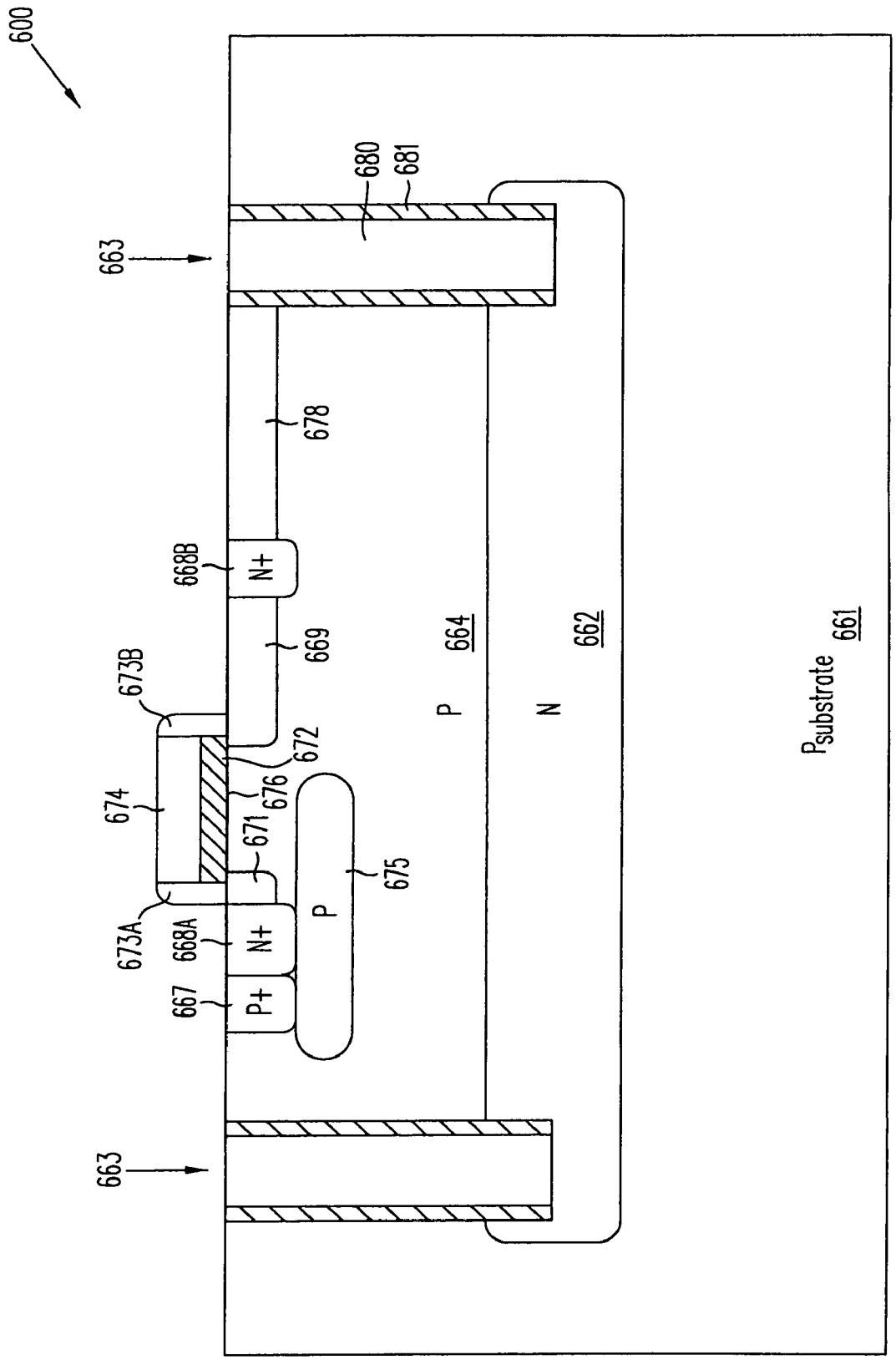
FIG. 6 illustrates a cross-sectional view of an N-channel depletion-mode MOSFET.

A schematic cross-section of an N-channel depletion-mode MOSFET 600 is shown in FIG. 6. MOSFET 600 is constructed similarly to the isolated N-channel lateral DMOS transistor 400 shown in FIG. 1, but without a well comparable to P-type well 465 present in the isolated pocket 664. Without the P-type well in isolated pocket 664, the threshold voltage of MOSFET 600 is set by the thickness of gate oxide layer 672 and the doping concentration of the isolated P-type pocket 664, which is substantially equal to the background doping concentration of substrate 661. This threshold voltage may vary from approximately −0.3V to +0.3V. Even if the threshold voltage is slightly positive, the MOSFET 600 will still conduct sufficient current at $V_{GS}=0$ to be used in start-up circuitry.

Snapback effects in depletion-mode N-channel MOSFETs are similar to those in enhancement mode MOSFETs. The structures to prevent snapback in the LDMOS 300 shown in FIG. 2 may be applied to depletion-mode devices in any combination.

The depletion-mode MOSFET 600 of FIG. 6 comprises an N+ drain region 668B with an N-type LDD drift region 669 between gate 674 and drain 668B. Gate 674 sits atop gate dielectric layer 672. LDD region 678 extends from drain 668B to filled trench 663. Lightly-doped source (LDS) region 671, an artifact of the CMOS process, is present under sidewall spacer 673A. N+ source region 668A self aligns to sidewall spacer 673A.

Deep P-type region 675 is disposed beneath at least a portion of gate 674 and may extend laterally beyond gate 674 to underlap LDD drift region 669, to reduce impact ionization and suppress snapback. Deep P-type region 675 is electrically tied to the surface of substrate 661 through P+ body contact region 667.

The concentration of P-type pocket 664 in channel region 676 beneath gate 674 is substantially the same as that of P-type substrate 661. In a preferred embodiment, the upper portion of DP region 675 is sufficiently deep to avoid doping channel region 676, such that the threshold voltage of MOSFET 600 is minimized. In other embodiments, the doping and depth of deep P-type region 675 may be adjusted to allow its doping profile to supplement the doping in channel region 676, in order to increase the threshold voltage to a desired value.

The depletion-mode MOSFET of FIG. 6 is isolated from P-type substrate 661 vertically by N-type floor isolation region 602 and laterally by filled trench 663, which laterally encloses isolated pocket 664. Electrical contact from the surface of substrate 661 to floor isolation region 662 is provided by conductive material 680 in a central portion of the filled trench 663. Insulating material 681 laterally surrounds the conductive material 680 to insulate conductive material from substrate 661 and isolated pocket 664.

Other embodiments of depletion-mode MOSFETs may be made similar to the LDMOS 300 of FIG. 2 but without P-body region 343, such that the threshold voltage is low and is set by the doping of isolated pocket 341B and possibly the upper portion of deep P-type region 365.

Isolated Diodes

In many power applications, an isolated high voltage rectifier diode is desirable, for example, to re-circulate inductor current during the break-before-make interval in switching converters.

Figure 7:
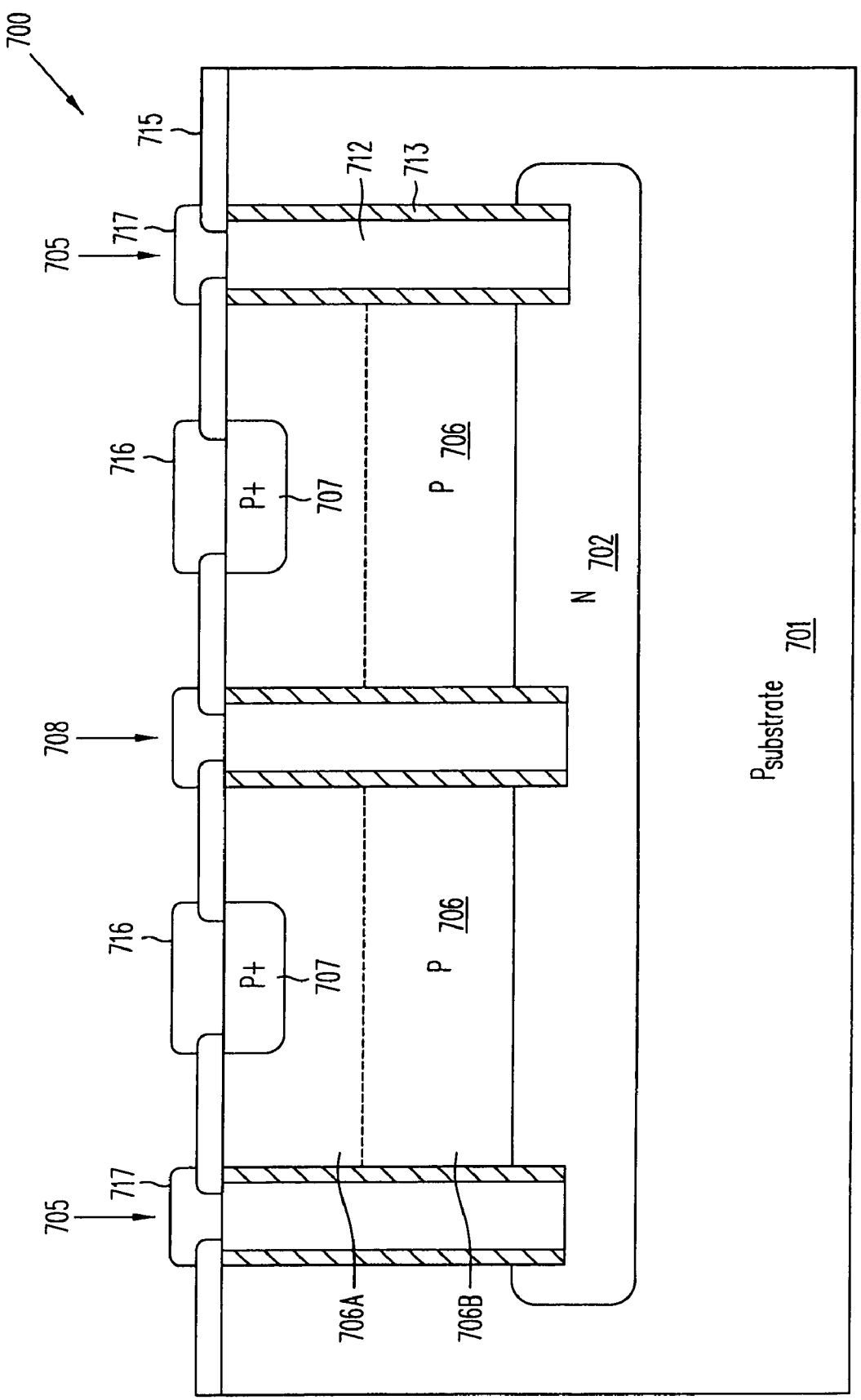
FIG. 7 illustrates a cross-sectional view of an isolated diode.

FIG. 7 illustrates one embodiment of an isolated diode 700 comprising an N-type buried region 702, which serves as the cathode of diode 700, and one or more P+ contact regions 707 enclosed within isolated P-type regions 706, which serve as the anode of diode 700. Filled trench 705 laterally surrounds the diode 700, providing lateral isolation, while N-type buried region 702 provides vertical isolation from P-type substrate 701. Electrical contact from the surface of the substrate 701 to N-type buried region 702 is provided by conductive material 712 at a central portion of the filled trench 705. Insulating material 713 laterally surrounds the conductive material 712 to insulate conductive material from substrate 701 and P-type regions 706. A dielectric layer 715 is formed on the surface of substrate 701 and patterned to form openings for anode contacts 716 and cathode contacts 717.

Additional filled trenches 708 may be included to divide the diode into smaller P-type regions and to provide a lower resistance contact to buried region 702. In a preferred embodiment, isolated P-type regions 706 may have substantially the same doping concentration as P-type substrate 701. This provides the lowest possible doping at the cathode-anode junction, allowing the highest breakdown voltage BV. Alternatively, an additional P-type well implant may be introduced to increase the doping concentration in regions 706, providing decreased resistance in the anode region and offering the ability to customize the BV to a lower value.

In one embodiment, the additional P-type well 706 has a non-monotonic doping profile comprising at least an upper portion 706A and a lower portion 706B, which is preferably formed using a boron chain implant of differing energies and doses. In one embodiment the lower portion 706B has a higher doping concentration than the upper portion 706A.

In power integrated circuits, there is often a need to form a Zener voltage clamp, i.e. a P-N diode meant to normally operate in reverse bias, and frequently in avalanche breakdown mode, to clamp a circuit voltage to maximum value. To provide proper protection, Zener diodes must often exhibit well controlled breakdown voltages between 6V and 20V, and this requires the use of P-N junctions with relatively high doping concentrations to produce such low BVs. Surface junctions, such as a junction formed by overlapping shallow N+ to P+ regions, do not make reliable Zener diode clamps because their cross sectional area is too thin, and avalanche breakdown occurs near a silicon-oxide interface. Thus, it is preferable to form Zener diode clamps using buried P-N junctions to achieve subsurface avalanche breakdown.

Figure 8:
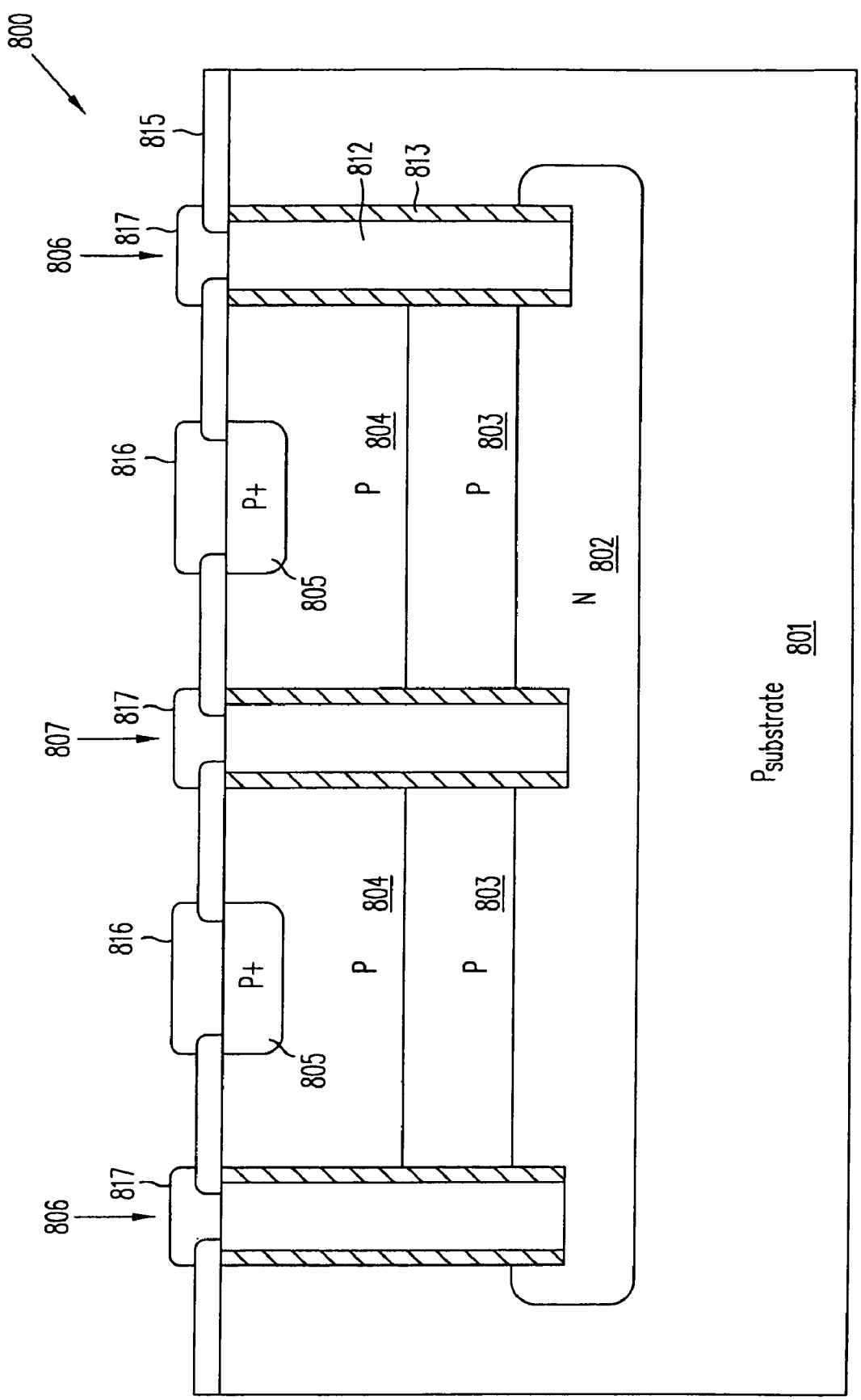
FIG. 8 illustrates a cross-sectional view of an isolated Zener diode.

FIG. 8 illustrates an isolated Zener diode 800 comprising heavily-doped buried N-type cathode region 802 and heavily-doped P-type anode region 803. P-type anode region 803 is preferably formed by a high-dose, high-energy implant. Contact from the surface of substrate 801 to anode region 803 is provided by P+ contact region 805 and optional P-well 804. If P-well 804 is not included, the doping in this region will be substantially the same as the doping of substrate 801. Electrical contact from the surface of the substrate to cathode region 802 is provided by conductive material 812 at a central portion of filled trench 806. Insulating material 813 laterally surrounds the conductive material 812 to insulate conductive material from substrate 801 and P-type regions 803 and 804. A dielectric layer 815 is formed on the surface of substrate 801 and patterned to form openings for anode contacts 816 and cathode contacts 817.

Additional filled trenches 807 may be included to divide the diode 800 into smaller anode regions 803 and to provide a lower resistance contact to cathode region 802.

In typical operation, the cathode region 802 is biased at a potential equal to or above that of grounded substrate 801. The anode region 803 may be reverse biased relative to the cathode, up to the breakdown voltage set by the doping on each side of the anode-cathode junction. This BV may be adjusted by the depth and dose of the high-energy implants that are preferably used to form the buried anode and cathode regions. By way of example, the buried anode region may be formed by an implant of phosphorous with a dose in the range of 1E13 to 1E14 cm$^{-2}$ and energy of 2000 to 3000 keV, and the cathode region may be formed by an implant of boron with a dose in the range of 1E13 to 1E14 cm$^{-2}$ and energy in the range of 400 to 2000 keV.

High-Voltage Termination of Type-I Isolated Devices

Another desirable feature of power integrated circuits is the ability to allow isolated devices to "float" to high voltages above the substrate potential. The maximum voltage of a floating device or isolated pocket does not depend on what is inside the isolated pocket, but instead depends on the way the pocket is terminated, i.e. what features border the exterior of the trench isolation sidewall.

One approach, illustrated throughout this disclosure, is to terminate isolated regions with filled trenches and constrain the lateral extent of the floor isolation region to the outer edge of the trenches. As discussed previously, these trenches may be filled entirely with dielectric material or the trenches may comprise conductive material in the center and dielectric material laterally enclosing the conductive material. While this approach is capable of supporting high voltages, it does not control surface electric fields and may be subject to charging and other time-dependent surface-related phenomena.

Another approach is to surround or border the exterior of the sidewall isolation trenches with one or more implanted junctions, field relief regions, and channel stops, collectively comprising a high-voltage "termination," as illustrated in a series of cross sections shown in FIGS. 9A-9D. In each illustration, a P-type pocket is isolated laterally from the surrounding substrate by a filled trench and is isolated vertically by an implanted floor isolation region. Although the filled trenches are shown to comprise conductive material in their centers, completely dielectrically filled trenches may be used in other embodiments.

The isolated P-type pockets shown in the cross sections of FIGS. 9A-9D may contain any combination of CMOS, DMOS transistors, JFETs and depletion-mode MOSFETs, NPN and PNP bipolar transistors, Zener and rectifier diodes, or even passive components such as resistors and capacitors, all constructed and made in accordance with this invention. Each figure includes a "CL" center-line marking, indicating an axis of rotation, such that the P-type pocket is enclosed on all sides by an isolating trench having an annular or closed geometry.

In each example, the DN floor isolation region is shown to extend beyond the trench by a distance $L_{DN}$, a dimension which may be varied parametrically from zero to tens of microns in length. When $L_{DN}$ is zero, the lateral edge of the DN floor isolation region is coincident with the outer edge of the trench. The DN floor isolation region is assumed to be electrically biased either through contact to an overlapping N-type well (as shown, for example, in FIG. 1) or by the conductive material in the filled trench. The outer edge of the termination is identified by a P+ guard ring, preventing surface inversion and functioning as a channel stop. Dimensions are referenced to the trench's outer edge and to the inner edge of the P+ guard ring. The P+ guard ring may include an optional deep P-type DP layer beneath it to contain minority carriers laterally and may also include an intervening P-type well as part of the guard ring structure.

Figure 9B:
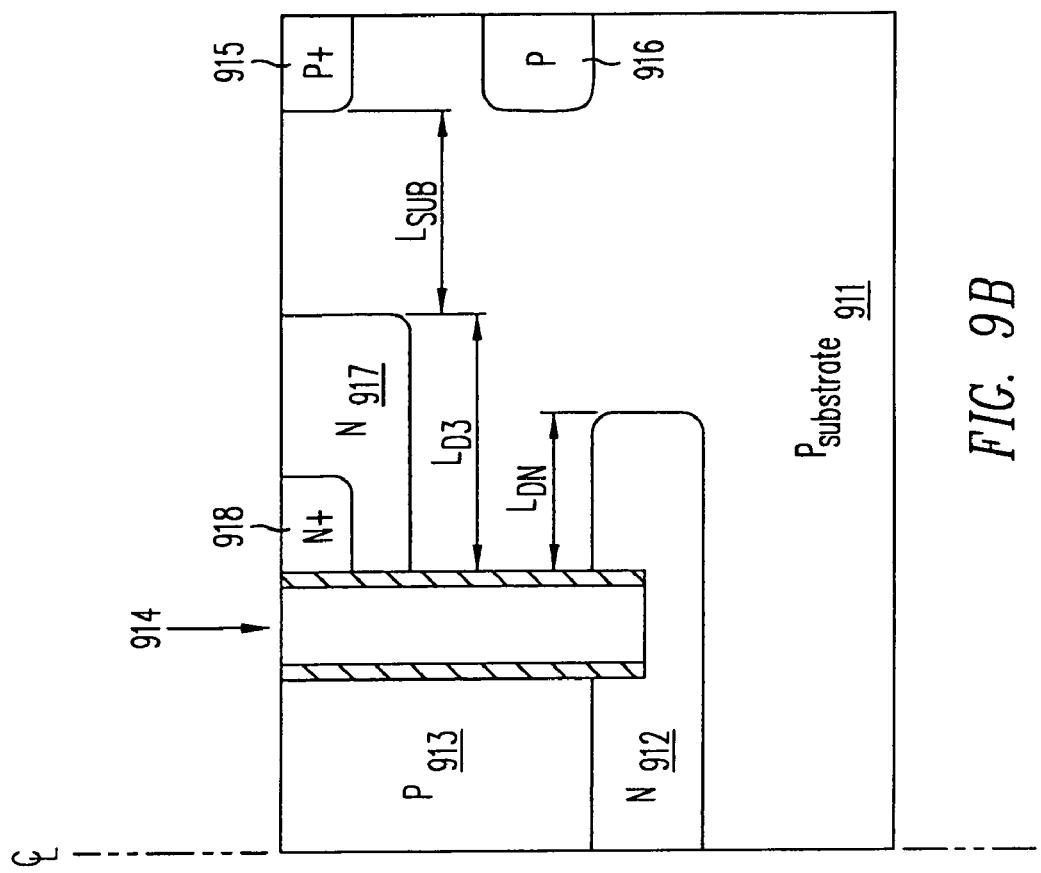
FIGS. 9A-9D illustrate cross-sectional views of termination structures for controlling surface electric fields and reducing charging and other time-dependent surface-related phenomena.
Figure 9A:
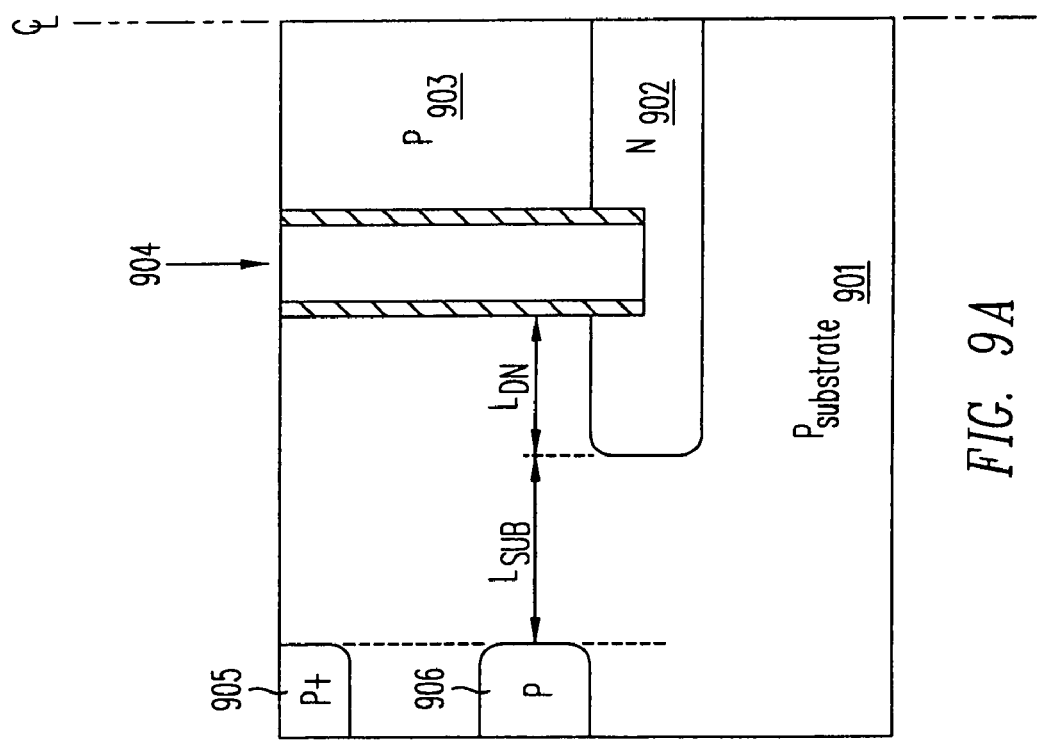

FIG. 9A shows an edge termination structure including N-type floor isolation region 902 and filled trench 904, which together isolate P-type pocket 903, and any device it may contain, from P-type substrate 901. Floor isolation region 902 extends beyond trench 904 by a distance $L_{DN}$. When floor isolation region 902 is biased to a more positive potential than substrate 901, a depletion region spreads into the portion of substrate 901 above the extended portion of floor isolation region 902, and this depletion region reduces the electric field at the silicon surface. The lateral distance between the edge of floor isolation region 902 and P+ guard ring 905 and underlying submerged P-type region 906 is labeled by the dimension $L_{SUB}$ and may range from one micron to tens-of-microns.

FIG. 9B shows an edge termination structure including floor isolation region 912 and filled trench 914, which together isolate P-type pocket 913, and any device it may contain, from P-type substrate 911. Floor isolation region 912 extends beyond trench 914 by a distance $L_{DN}$. Deep implanted N-type drift region 917 of length $L_{D3}$ is contacted by N+ region 918. Drift region 917 may be biased at the same potential as floor isolation region 912, or may be biased to a fixed potential. The outer edge of drift region 917 is spaced from P+ guard ring 915 and underlying deep P-type region 916 by a space $L_{SUB}$.

The function of drift region 917 is to suppress surface electric fields by exhibiting two-dimensional depletion spreading effects. Provided that drift region 917 has sufficiently low integrated charge $Q_D$, typically in the range of $1\times10^{12}$ cm$^{-2}$ to $5\times10^{12}$ cm$^{-2}$, increasing the applied voltage on the P-N junction formed by drift region 917 and P-type substrate 911 results in depletion spreading into drift region 917 and eventually the complete depletion of drift region 917. Under such conditions, drift region 917 behaves similar to intrinsic material in a P-I-N diode, and the surface electric field drops substantially in accordance with the well-known RESURF principle of two-dimensional electrically-induced P-I-N junctions. Furthermore, the vertical overlap of drift region 917 above floor isolation region 912 enhances the depletion of P-type substrate 911 in the intervening region between the regions 917 and 912, further reducing the surface electric fields within the termination.

Figure 9D:
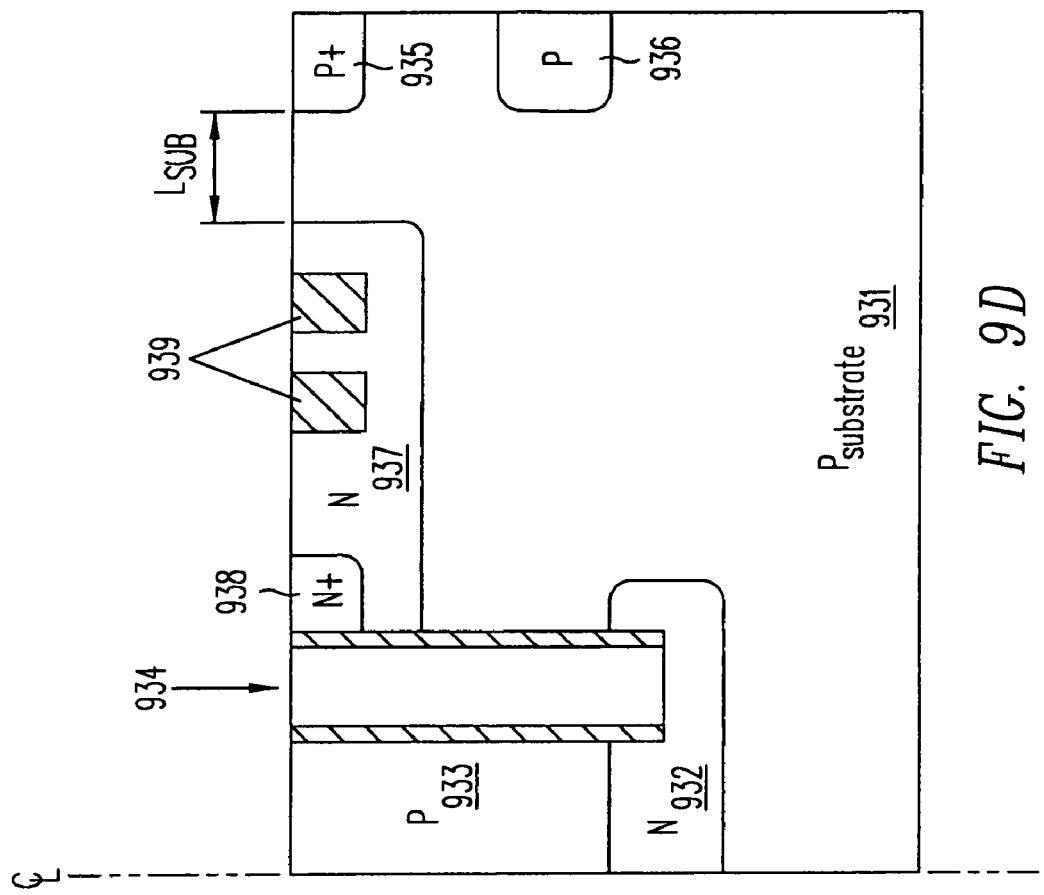
Figure 9C:
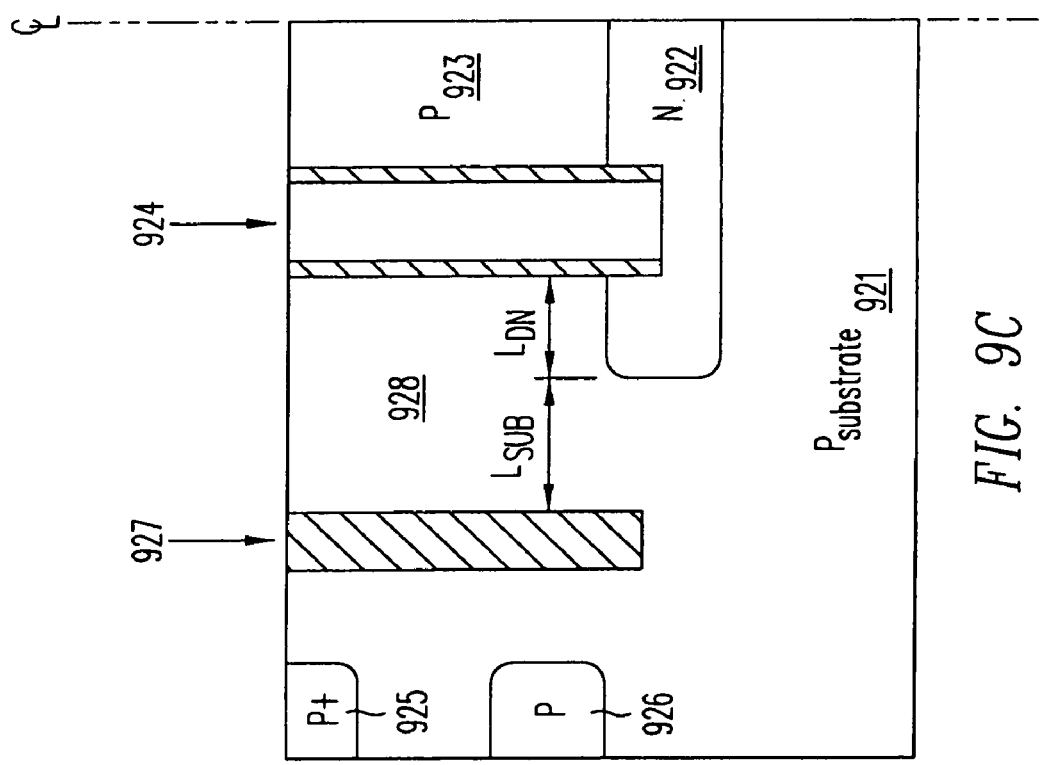

FIG. 9C shows an edge termination structure including floor isolation region 922 and filled trench 924, which together isolate P-type pocket 923, and any device it may contain, from P-type substrate 921. Floor isolation region 922 extends beyond trench 924 by a distance $L_{DN}$ and spaced from trench 927 by a distance $L_{SUB}$. In this embodiment, the gap between floor isolation region 922 and trench 927, i.e. a gap of dimension $L_{SUB}$, controls the potential of P-type substrate 921 in the surface region between trenches 924 and 927, i.e. in the area labeled 928. When the gap between floor isolation region 922 and trench 927 becomes fully depleted, the potential of P-type region 928 begins to float. Cut off from the substrate potential, the surface electric field drops. A P+ guard ring 925 circumscribes the device and may include underlying deep P-type region 926.

FIG. 9D shows an edge termination structure including floor isolation region 932 and filled trench 934, which together isolate P-type pocket 933, and any device it may contain, from P-type substrate 931. Floor isolation region 932 extends beyond trench 934. Deep implanted N-type drift region 937 is contacted by N+ region 938. Drift region 937 may be biased at the same potential as floor isolation region 932, or may be biased to a fixed potential. Within drift region 937, one or more filled trenches 939 are formed. Each of trenches 939 reduce the local doping concentration in drift region 937, which allows the adjacent portion of drift region 937 to be depleted more easily, further lowering the local electric field. In a preferred embodiment, trenches 939 are narrower and shallower than trench 934 and are completely filled with dielectric material. In one embodiment, the device is designed such that the proportion of the surface area of trenches 939 to the surface area of drift region 937 changes increases as the lateral distance from trench 934 increases. This allows the portions of drift region 937 that are farthest away from isolated pocket 933 to deplete more easily than the portions that are closer to pocket 933, thus providing an effect similar to a graded junction termination, which is effective in minimizing the lateral distance required to support a given BV. The outer edge of drift region 937 is spaced from P+ guard ring 935 and underlying deep P-type region 936 by a space $L_{SUB}$.

The embodiments described herein are intended to be illustrative and not limiting. Many alternative embodiments within the broad scope of this invention will be obvious to persons of skill in the art from the descriptions herein.

We claim:

1. An isolated diode formed in a P-type semiconductor substrate, the substrate not comprising an epitaxial layer, the isolated diode comprising:
   an N-type floor isolation region submerged in the substrate;
   a trench extending from a surface of the substrate at least to the floor isolation region, the trench having a central portion filled with a conductive material and a dielectric material lining the walls of the trench, the conductive material providing electrical contact from the floor isolation region to the surface of the substrate, the trench and the floor isolation region together forming an isolated pocket of the substrate; and
   a P-type anode region in the isolated pocket, the anode region extending from the surface of the substrate to the floor isolation region, the anode region comprising a shallow portion and a deep portion, the shallow portion being located adjacent the surface of the substrate, the deep portion being located below the shallow portion, the shallow portion having a first doping concentration, the deep portion having a second doping concentration, the second doping concentration being greater than the first doping concentration.

2. The isolated diode of claim 1 comprising:
   a dielectric layer above the surface of the substrate, the dielectric layer having a first opening above the anode region and a second opening above the conductive material;
   an anode contact in the first opening in contact with the anode region; and
   a cathode contact in the second opening in contact with the conductive material.

3. The isolated diode of claim 1 wherein the deep portion of the anode region forms a junction with the floor isolation region.

* * * * *